United States Patent
Hirayama et al.

(10) Patent No.: US 12,232,423 B2
(45) Date of Patent: Feb. 18, 2025

(54) PIEZOELECTRIC CERAMIC COMPOSITION

(71) Applicant: KYOCERA CORPORATION, Kyoto (JP)

(72) Inventors: Takeshi Hirayama, Kirishima (JP); Shuhei Tabata, Kirishima (JP); Gen Shimura, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 647 days.

(21) Appl. No.: 17/438,402

(22) PCT Filed: Mar. 2, 2020

(86) PCT No.: PCT/JP2020/008601
§ 371 (c)(1),
(2) Date: Sep. 10, 2021

(87) PCT Pub. No.: WO2020/184242
PCT Pub. Date: Sep. 17, 2020

(65) Prior Publication Data
US 2022/0158076 A1 May 19, 2022

(30) Foreign Application Priority Data

Mar. 13, 2019 (JP) .................. 2019-046104

(51) Int. Cl.
*H10N 30/853* (2023.01)
*B41J 2/14* (2006.01)
(Continued)

(52) U.S. Cl.
CPC ....... *H10N 30/8542* (2023.02); *C01G 33/006* (2013.01); *C01G 35/006* (2013.01);
(Continued)

(58) Field of Classification Search
CPC .............. H10N 30/8542; C01G 33/006; C01G 35/006; C01P 2002/52; C01P 2002/60; C01P 2006/40
(Continued)

(56) References Cited

U.S. PATENT DOCUMENTS

2015/0099085 A1  4/2015  Nagareda et al.

FOREIGN PATENT DOCUMENTS

CN          107382318 A      11/2017
DE      102007016854 A1      10/2008
(Continued)

OTHER PUBLICATIONS

Xiaolian Chao et al, "Phase structures, electrical properties and temperature stability of (1-x)[(K0.458Na0.542) 0.96Li0.04](Nb0.85Ta0.15)O3-xBiFeO3 ceramics", Journal of Alloys and Compounds, 2012, vol. 518, pp. 1-5, 5pp.
(Continued)

*Primary Examiner* — Anita Nassiri-Motlagh
(74) *Attorney, Agent, or Firm* — HAUPTMAN HAM, LLP (57) ABSTRACT

A piezoelectric ceramic composition is represented by a composition formula $A_xBO_3$ and includes potassium sodium niobate containing K and Na that account for 80% or more of an amount of A-site elements and containing Nb that accounts for 70% or more of an amount of B-site elements. The piezoelectric ceramic composition contains Ta and Fe at a B-site.

14 Claims, 7 Drawing Sheets

| No. | u Na | v Li | x A | w Ag | y Ta | z Sb | A1 | B1 | B2 | Fe | α | β | γ | δ | d31 pC/N | R kV/mm |
|---|---|---|---|---|---|---|---|---|---|---|---|---|---|---|---|---|
| 1 | 0.524 | 0.05 | 1 | 0.04 | 0.1 | 0.06 | Bi | Zn | Sn | - | 0.0025 | 0.00125 | 0.00125 | 0 | 110 | 1.E+08 |
| 2 | 0.524 | 0.05 | 1 | 0.04 | 0.1 | 0.06 | Bi | Zn | Sn | Fe | 0.0045 | 0.00125 | 0.00125 | 0.001 | 112 | 3.E+08 |
| 3 | 0.524 | 0.05 | 1 | 0.04 | 0.1 | 0.06 | Bi | Zn | Sn | Fe | 0.005 | 0.00125 | 0.00125 | 0.00125 | 115 | 3.E+09 |
| 4 | 0.524 | 0.05 | 1 | 0.04 | 0.1 | 0.06 | Bi | Zn | Sn | Fe | 0.0075 | 0.00125 | 0.00125 | 0.0025 | 117 | 5.E+09 |
| 5 | 0.524 | 0.05 | 1 | 0.04 | 0.1 | 0.06 | Bi | Zn | Sn | Fe | 0.0125 | 0.00125 | 0.00125 | 0.005 | 102 | 6.E+09 |
| 6 | 0.524 | 0.05 | 1 | 0.04 | 0.1 | 0.06 | Bi | Zn | Sn | Fe | 0.0225 | 0.00125 | 0.00125 | 0.01 | 99 | 4.E+10 |
| 7 | 0.524 | 0.05 | 1 | 0.04 | 0.1 | 0.06 | Bi | Zn | Sn | Fe | 0.0275 | 0.00125 | 0.00125 | 0.0125 | 88 | 4.E+10 |
| 8 | 0.524 | 0.05 | 1 | 0.04 | 0.1 | 0.06 | Bi | Zn | Sn | Fe | 0.032 | 0.00125 | 0.00125 | 0.015 | 78 | 6.E+10 |
| 9 | 0.524 | 0.05 | 1 | 0 | 0 | 0 | Bi | - | - | Fe | 0.01 | 0 | 0 | 0.005 | 0 | ≤1E+5 |
| 10 | 0.524 | 0.05 | 1 | 0 | 0 | 0 | Bi | - | - | Fe | 0.02 | 0 | 0 | 0.01 | 0 | ≤1E+5 |
| 11 | 0.524 | 0.05 | 1 | 0 | 0 | 0.03 | - | - | - | - | 0 | 0 | 0 | 0 | 0 | ≤1E+5 |
| 12 | 0.524 | 0.05 | 1 | 0 | 0 | 0.06 | - | - | - | - | 0 | 0 | 0 | 0 | 0 | ≤1E+5 |
| 13 | 0.524 | 0.05 | 1 | 0 | 0 | 0.09 | - | - | - | - | 0 | 0 | 0 | 0 | 60 | ≤1E+5 |
| 14 | 0.524 | 0.02 | 1 | 0 | 0.05 | 0 | - | - | - | - | 0 | 0 | 0 | 0 | 48 | ≤1E+5 |
| 15 | 0.524 | 0.05 | 1 | 0 | 0.1 | 0 | - | - | - | - | 0 | 0 | 0 | 0 | 67 | ≤1E+5 |

(51) Int. Cl.
*C01G 33/00* (2006.01)
*C01G 35/00* (2006.01)

(52) U.S. Cl.
CPC ....... *B41J 2/14201* (2013.01); *C01P 2002/52* (2013.01); *C01P 2002/60* (2013.01); *C01P 2006/40* (2013.01)

(58) Field of Classification Search
USPC .................................................. 252/62.9 R
See application file for complete search history.

(56) References Cited

FOREIGN PATENT DOCUMENTS

| | | |
|---|---|---|
| JP | 2007145650 A | 6/2007 |
| WO | 2014002285 A1 | 1/2014 |

OTHER PUBLICATIONS

Minhong Jiang et al, "Effect of BiFeO3 additions on the dielectric and piezoelectric properties of (K0.44Na0.52Li0.04) (Nb0.84Ta0.1Sb0.06)O3 ceramics", Materials Research Bulletin, 2010, vol. 45, pp. 220-223, 4pp.

Huan Li et al, Room-Temperature Magnetocapacitance in Fe-Doped K0.5Na0.5Nb0.95Ta0.05O3 Ceramics, Applied Physics Express, 2012, vol. 5, pp. 101501-1-101501-3, 4pp.

Bongkarn T, et al, "Excellent piezoelectric and ferroelectric properties of KNLNTS ceramics with Fe2O3 doping synthesized by the solid state combustion technique", Journal of Alloys and Compounds, 2016, vol. 682, pp. 14-21, 8pp.

Guo J, et al, "High-Performance Small-Amount Fe2O3-Doped(K, Na) NbO3-Based Lead-Free Piezoceramics with Irregular Phase Evolution", Journal of the American Ceramic Society, vol. 99, No. 7, Mar. 26, 2016, pp. 2341-2346, 6pp.

FIG. 1

| No. | u Na | v Li | x A | w Ag | y Ta | z Sb | A1 | B1 | B2 | Fe | α | β | γ | δ | d31 pC/N | R kV/mm |
|---|---|---|---|---|---|---|---|---|---|---|---|---|---|---|---|---|
| 1 | 0.524 | 0.05 | 1 | 0.04 | 0.1 | 0.06 | Bi | Zn | Sn | — | 0.0025 | 0.00125 | 0.00125 | 0 | 110 | 1.E+08 |
| 2 | 0.524 | 0.05 | 1 | 0.04 | 0.1 | 0.06 | Bi | Zn | Sn | Fe | 0.0045 | 0.00125 | 0.00125 | 0.001 | 112 | 3.E+08 |
| 3 | 0.524 | 0.05 | 1 | 0.04 | 0.1 | 0.06 | Bi | Zn | Sn | Fe | 0.005 | 0.00125 | 0.00125 | 0.00125 | 115 | 3.E+09 |
| 4 | 0.524 | 0.05 | 1 | 0.04 | 0.1 | 0.06 | Bi | Zn | Sn | Fe | 0.0075 | 0.00125 | 0.00125 | 0.0025 | 117 | 5.E+09 |
| 5 | 0.524 | 0.05 | 1 | 0.04 | 0.1 | 0.06 | Bi | Zn | Sn | Fe | 0.0125 | 0.00125 | 0.00125 | 0.005 | 102 | 6.E+09 |
| 6 | 0.524 | 0.05 | 1 | 0.04 | 0.1 | 0.06 | Bi | Zn | Sn | Fe | 0.0225 | 0.00125 | 0.00125 | 0.01 | 99 | 4.E+10 |
| 7 | 0.524 | 0.05 | 1 | 0.04 | 0.1 | 0.06 | Bi | Zn | Sn | Fe | 0.0275 | 0.00125 | 0.00125 | 0.0125 | 88 | 4.E+10 |
| 8 | 0.524 | 0.05 | 1 | 0.04 | 0.1 | 0.06 | Bi | Zn | Sn | Fe | 0.032 | 0.00125 | 0.00125 | 0.015 | 78 | 6.E+10 |
| 9 | 0.524 | 0.05 | 1 | 0 | 0 | 0 | Bi | — | — | Fe | 0.01 | 0 | 0 | 0.005 | 0 | ≤1E+5 |
| 10 | 0.524 | 0.05 | 1 | 0 | 0 | 0 | Bi | — | — | Fe | 0.02 | 0 | 0 | 0.01 | 0 | ≤1E+5 |
| 11 | 0.524 | 0.05 | 1 | 0 | 0 | 0.03 | — | — | — | — | 0 | 0 | 0 | 0 | 0 | ≤1E+5 |
| 12 | 0.524 | 0.05 | 1 | 0 | 0 | 0.06 | — | — | — | — | 0 | 0 | 0 | 0 | 0 | ≤1E+5 |
| 13 | 0.524 | 0.05 | 1 | 0 | 0 | 0.09 | — | — | — | — | 0 | 0 | 0 | 0 | 60 | ≤1E+5 |
| 14 | 0.524 | 0.02 | 1 | 0 | 0.05 | 0 | — | — | — | — | 0 | 0 | 0 | 0 | 48 | ≤1E+5 |
| 15 | 0.524 | 0.05 | 1 | 0 | 0.1 | 0 | — | — | — | — | 0 | 0 | 0 | 0 | 67 | ≤1E+5 |

FIG. 2

| No. | u Na | v Li | x A | w Ag | y Ta | z Sb | A1 | B1 | B2 | Fe | α | β | γ | δ | d31 pC/N | R kV/mm |
|---|---|---|---|---|---|---|---|---|---|---|---|---|---|---|---|---|
| 16 | 0.5 | 0.05 | 1 | 0.04 | 0.1 | 0.06 | Bi | Zn | Sn | Fe | 0.0075 | 0.00125 | 0.00125 | 0.0025 | 81 | 1.E+09 |
| 17 | 0.54 | 0.05 | 1 | 0.04 | 0.1 | 0.06 | Bi | Zn | Sn | Fe | 0.0075 | 0.00125 | 0.00125 | 0.0025 | 106 | 3.E+09 |
| 18 | 0.524 | 0.02 | 1 | 0.04 | 0.1 | 0.06 | Bi | Zn | Sn | Fe | 0.0075 | 0.00125 | 0.00125 | 0.0025 | 90 | 9.E+08 |
| 19 | 0.524 | 0.06 | 1 | 0.04 | 0.1 | 0.06 | Bi | Zn | Sn | Fe | 0.0075 | 0.00125 | 0.00125 | 0.0025 | 100 | 3.E+09 |
| 20 | 0.524 | 0.05 | 1 | 0.02 | 0.1 | 0.06 | Bi | Zn | Sn | Fe | 0.0075 | 0.00125 | 0.00125 | 0.0025 | 110 | 3.E+09 |
| 21 | 0.524 | 0.05 | 1 | 0.06 | 0.1 | 0.06 | Bi | Zn | Sn | Fe | 0.0075 | 0.00125 | 0.00125 | 0.0025 | 110 | 3.E+09 |
| 22 | 0.524 | 0.05 | 1 | 0.04 | 0.02 | 0.06 | Bi | Zn | Sn | Fe | 0.0075 | 0.00125 | 0.00125 | 0.0025 | 80 | 1.E+09 |
| 23 | 0.524 | 0.05 | 1 | 0.04 | 0.04 | 0.06 | Bi | Zn | Sn | Fe | 0.0075 | 0.00125 | 0.00125 | 0.0025 | 97 | 3.E+09 |
| 24 | 0.524 | 0.05 | 1 | 0.04 | 0.06 | 0.06 | Bi | Zn | Sn | Fe | 0.0075 | 0.00125 | 0.00125 | 0.0025 | 104 | 2.E+09 |
| 25 | 0.524 | 0.05 | 1 | 0.04 | 0.08 | 0.06 | Bi | Zn | Sn | Fe | 0.0075 | 0.00125 | 0.00125 | 0.0025 | 110 | 1.E+09 |
| 26 | 0.524 | 0.05 | 1 | 0.04 | 0.1 | 0 | Bi | Zn | Sn | Fe | 0.0075 | 0.00125 | 0.00125 | 0.0025 | 80 | 8.E+08 |
| 27 | 0.524 | 0.05 | 1 | 0.04 | 0.1 | 0.08 | Bi | Zn | Sn | Fe | 0.0075 | 0.00125 | 0.00125 | 0.0025 | 111 | 2.E+09 |
| 28 | 0.524 | 0.05 | 1 | 0.04 | 0.1 | 0.1 | Bi | Zn | Sn | Fe | 0.0075 | 0.00125 | 0.00125 | 0.0025 | 81 | 2.E+09 |
| 29 | 0.524 | 0.05 | 0.99 | 0.04 | 0.1 | 0.06 | Bi | Zn | Sn | Fe | 0.0075 | 0.00125 | 0.00125 | 0.0025 | 120 | 1.E+09 |
| 30 | 0.524 | 0.05 | 1.02 | 0.04 | 0.1 | 0.06 | Bi | Zn | Sn | Fe | 0.0075 | 0.00125 | 0.00125 | 0.0025 | 108 | 1.E+09 |

FIG. 3

| No. | u Na | v Li | x A | w Ag | y Ta | z Sb | A1 | B1 | B2 | Fe | α | β | γ | δ | d31 pC/N | R kV/mm |
|---|---|---|---|---|---|---|---|---|---|---|---|---|---|---|---|---|
| 31 | 0.524 | 0.05 | 1 | 0.04 | 0.1 | 0.06 | Bi | Mg | Ti | Fe | 0.0075 | 0.00125 | 0.00125 | 0.0025 | 99 | 1.E+09 |
| 32 | 0.524 | 0.05 | 1 | 0.04 | 0.1 | 0.06 | Bi | Zn | Ti | Fe | 0.0075 | 0.00125 | 0.00125 | 0.0025 | 97 | 1.E+09 |
| 33 | 0.524 | 0.05 | 1 | 0.04 | 0.1 | 0.06 | Bi | Zn | Zr | Fe | 0.0075 | 0.00125 | 0.00125 | 0.0025 | 105 | 1.E+09 |
| 34 | 0.524 | 0.05 | 1 | 0.04 | 0.1 | 0.06 | Bi | Zn | Hf | Fe | 0.0075 | 0.00125 | 0.00125 | 0.0025 | 113 | 1.E+09 |
| 35 | 0.524 | 0.05 | 1 | 0.04 | 0.1 | 0.06 | Bi | Zn | Ce | Fe | 0.0075 | 0.00125 | 0.00125 | 0.0025 | 88 | 3.E+09 |
| 36 | 0.524 | 0.05 | 1 | 0.04 | 0.1 | 0.06 | Bi | Yb | Hf | Fe | 0.0075 | 0.00125 | 0.00125 | 0.0025 | 84 | 1.E+09 |
| 37 | 0.524 | 0.05 | 1 | 0.04 | 0.1 | 0.06 | Bi | Yb | Sn | Fe | 0.0075 | 0.00125 | 0.00125 | 0.0025 | 89 | 1.E+09 |
| 38 | 0.524 | 0.05 | 1 | 0.04 | 0.1 | 0.06 | Bi | Fe | Sn | Fe | 0.0075 | 0.00125 | 0.00125 | 0.0025 | 106 | 2.E+09 |
| 39 | 0.524 | 0.05 | 1 | 0.04 | 0.1 | 0.06 | Bi | Cu | Sn | Fe | 0.0075 | 0.00125 | 0.00125 | 0.0025 | 112 | 1.E+09 |
| 40 | 0.524 | 0.05 | 1 | 0.04 | 0.1 | 0.06 | Bi | Mg | Ti | Fe | 0.0075 | 0.00125 | 0.00125 | 0.0025 | 112 | 1.E+09 |
| 41 | 0.524 | 0.05 | 1 | 0.04 | 0.1 | 0.06 | Bi | Fe | Ti | Fe | 0.0075 | 0.00125 | 0.00125 | 0.0025 | 98 | 4.E+09 |
| 42 | 0.524 | 0.05 | 1 | 0.04 | 0.1 | 0.06 | Bi | Cu | Ge | Fe | 0.0075 | 0.00125 | 0.00125 | 0.0025 | 110 | 2.E+09 |
| 43 | 0.524 | 0.05 | 1 | 0.04 | 0.1 | 0.06 | Bi | Zn | V | Fe | 0.0075 | 0.00125 | 0.00125 | 0.0025 | 112 | 4.E+09 |
| 44 | 0.524 | 0.05 | 1 | 0.04 | 0.1 | 0.06 | Bi | Zn | V | Fe | 0.0075 | 0.00167 | 0.00083 | 0.0025 | 89 | 2.E+09 |
| 45 | 0.524 | 0.05 | 1 | 0.04 | 0.1 | 0.06 | Bi | Zn | W | Fe | 0.0075 | 0.00187 | 0.00063 | 0.0025 | 83 | 1.E+09 |

FIG. 4

| No. | u Na | v Li | x A | w Ag | y Ta | z Sb | A1 | B1 | B2 | Fe | α | β | γ | δ | d31 pC/N | R kV/mm |
|---|---|---|---|---|---|---|---|---|---|---|---|---|---|---|---|---|
| 46 | 0.524 | 0.05 | 1 | 0.04 | 0.1 | 0.06 | Bi | Co | Nb | Fe | 0.0075 | 0.00167 | 0.00083 | 0.0025 | 114 | 1.E+09 |
| 47 | 0.524 | 0.05 | 1 | 0.04 | 0.1 | 0.06 | Bi | Co | Sb | Fe | 0.0075 | 0.00167 | 0.00083 | 0.0025 | 114 | 2.E+09 |
| 48 | 0.524 | 0.05 | 1 | 0.04 | 0.1 | 0.06 | Bi | Co | Ta | Fe | 0.0075 | 0.00167 | 0.00083 | 0.0025 | 113 | 1.E+09 |
| 49 | 0.524 | 0.05 | 1 | 0.04 | 0.1 | 0.06 | Bi | Ni | Nb | Fe | 0.0075 | 0.00167 | 0.00083 | 0.0025 | 114 | 3.E+09 |
| 50 | 0.524 | 0.05 | 1 | 0.04 | 0.1 | 0.06 | Bi | Ni | Sb | Fe | 0.0075 | 0.00167 | 0.00083 | 0.0025 | 114 | 1.E+09 |
| 51 | 0.524 | 0.05 | 1 | 0.04 | 0.1 | 0.06 | Bi | Ni | Ta | Fe | 0.0075 | 0.00167 | 0.00083 | 0.0025 | 117 | 2.E+09 |
| 52 | 0.524 | 0.05 | 1 | 0.04 | 0.1 | 0.06 | Bi | Zn | Sb | Fe | 0.0075 | 0.00167 | 0.00083 | 0.0025 | 114 | 3.E+09 |
| 53 | 0.524 | 0.05 | 1 | 0.04 | 0.1 | 0.06 | La | Zn | Sn | Fe | 0.0075 | 0.00125 | 0.00125 | 0.0025 | 100 | 4.E+09 |
| 54 | 0.524 | 0.05 | 1 | 0.04 | 0.1 | 0.06 | Ce | Zn | Sn | Fe | 0.0075 | 0.00125 | 0.00125 | 0.0025 | 99 | 1.E+09 |
| 55 | 0.524 | 0.05 | 1 | 0.04 | 0.1 | 0.06 | Nd | Zn | Sn | Fe | 0.0075 | 0.00125 | 0.00125 | 0.0025 | 98 | 3.E+09 |
| 56 | 0.524 | 0.05 | 1 | 0.04 | 0.1 | 0.06 | Sm | Zn | Sn | Fe | 0.0075 | 0.00125 | 0.00125 | 0.0025 | 100 | 2.E+09 |

| No. | Fe/Ta | | | | Sb/Ta | | | | d31 pC/N | R kV/mm |
|---|---|---|---|---|---|---|---|---|---|---|
| | Ta-Rich | | Ta-Poor | | Ta-Rich | | Ta-Poor | | | |
| | Raw Data | Ratio | Raw Data | Ratio | Raw Data | Ratio | Raw Data | Ratio | | |
| 1 | 0 / 21.78 | 0% | 0 / 2.84 | 0% | 1.58 / 21.78 | 7% | 2.18 / 2.84 | 77% | 110 | 1.E+08 |
| 2 | 0.12 / 18.3 | 1% | 0.04 / 2.71 | 1% | 1.52 / 18.3 | 8% | 1.84 / 2.71 | 68% | 112 | 3.E+08 |
| 3 | 0.20 / 15.7 | 1% | 0.09 / 2.40 | 4% | 1.49 / 15.7 | 9% | 1.78 / 2.40 | 74% | 115 | 3.E+09 |
| 4 | 0.39 / 13.6 | 3% | 0.13 / 2.20 | 6% | 1.52 / 13.6 | 11% | 1.82 / 2.20 | 83% | 117 | 5.E+09 |
| 5 | 0.75 / 13.2 | 6% | 0.17 / 2.30 | 7% | 1.54 / 13.2 | 12% | 1.85 / 2.30 | 80% | 102 | 6.E+09 |
| 6 | 1.20 / 12.8 | 9% | 0.23 / 2.43 | 9% | 1.48 / 12.8 | 12% | 1.79 / 2.43 | 74% | 99 | 4.E+10 |
| 7 | 1.52 / 12.2 | 12% | 0.31 / 2.48 | 13% | 1.41 / 12.2 | 12% | 1.82 / 2.48 | 73% | 88 | 4.E+10 |
| 8 | 1.8 / 12.4 | 15% | 0.40 / 2.50 | 16% | 1.40 / 12.4 | 11% | 1.91 / 2.50 | 76% | 78 | 6.E+10 |

FIG. 7

PIEZOELECTRIC CERAMIC COMPOSITION

RELATED APPLICATIONS

The present application is a National Phase of International Application No. PCT/JP2020/008601, filed Mar. 2, 2020, and claims priority based on Japanese Patent Application No. 2019-046104, filed Mar. 13, 2019.

TECHNICAL FIELD

The present disclosure relates to a piezoelectric ceramic composition.

BACKGROUND ART

Piezoelectric ceramic compositions used in, for example, actuators, sensors, vibrators, or filters are known. Various potassium sodium niobate-based piezoelectric ceramic compositions have been proposed as lead-free piezoelectric ceramic compositions (for example, PTL 1 and PTL 2).

CITATION LIST

Patent Literature

PTL 1: Japanese Unexamined Patent Application Publication No. 2007-145650
PTL 2: International Publication No. 2014/002285

SUMMARY OF INVENTION

A piezoelectric ceramic composition according to an aspect of the present disclosure is a piezoelectric ceramic composition represented by a composition formula $A_xBO_3$ and including potassium sodium niobate containing K and Na that account for 80% or more of an amount of A-site elements and containing Nb that accounts for 70% or more of an amount of B-site elements. The piezoelectric ceramic composition contains Ta and Fe at a B-site.

DESCRIPTION OF EMBODIMENTS (Composition of Piezoelectric Ceramic Composition)
A piezoelectric ceramic composition according to an embodiment is a potassium sodium niobate-based (KNN-based, alkali niobate-based) piezoelectric ceramic composition and does not contain lead (Pb). The KNN-based piezoelectric ceramic composition is represented by, for example, a simplified composition formula $A_xBO_3$. The A-site mainly contains K (potassium) and Na (sodium), the B-site mainly contains Nb (niobium), and x (molar ratio) is, for example, approximately 1. The piezoelectric ceramic composition has a perovskite structure.

More specifically, the piezoelectric ceramic composition according to an embodiment is represented by the following composition formula.

$$\{(K_{1-u-v}Na_uLi_v)_{1-w-\alpha}Ag_wAl_\alpha\}_x\{(Nb_{1-y-z}Ta_ySb_z)_{1-\beta-\gamma-\delta}B1_\beta B2_\gamma Fe_\delta\}O_3 \quad (1)$$

In formula (1) above, A1, B1, and B2 are metal elements. Note that Li represents lithium, Ag represents silver, Ta represents tantalum, Sb represents antimony, and Fe represents iron. In formula (1), u, v, w, y, z, α, β, γ, and δ each represent a molar ratio.

As described above, the molar ratio (x) of the A-site to the B-site is approximately 1 (for example, 0.95 or more and 1.05 or less). The ratio of the amount of K and Na elements that accounts for the amount of the A-site elements is relatively large. For example, the molar ratio ((1−v)×(1−w−α)) of the proportion of K and Na that account for the A-site may be 0.80 or more, 0.85 or more, or 0.90 or more. The ratio of the amount of Nb element that accounts for the amount of the B-site elements is relatively large. For example, the molar ratio ((1−y−z)×(1−β−γ−δ)) of the proportion of Nb that accounts for the B-site may be 0.70 or more, 0.75 or more, or 0.80 or more.

The molar ratio (1−u−v:u) of K to Na is approximately 1:1, provided that the amount of Na element may be larger than the amount of K element. That is, the piezoelectric ceramic composition according to an embodiment may be a Na-rich KNN. For example, u/(1−u−v) may be 1.01 or more, 1.1 or more, or 1.2 or more, and 1.5 or less, 1.4 or less, or 1.3 or less. The lower limit and the upper limit may be appropriately combined.

The piezoelectric ceramic composition contains, in addition to K and Na, which are alkali metals, Li, which is also an alkali metal, at the A-site. Specifically, the piezoelectric ceramic composition according to an embodiment is a potassium sodium lithium niobate-based piezoelectric ceramic composition. The molar ratio of Li to K and Na (in another viewpoint, the ratio of the amount of Li element that accounts for the amount of the A-site elements) is relatively small. For example, the molar ratio (v×(1−w−α)) of the proportion of Li that accounts for the A-site may be 0.1 or less, 0.06 or less, or 0.05 or less. The ratio of the amount of Li, K, and Na elements that accounts for the amount of the A-site elements is relatively large. For example, the molar ratio (1−w−α) of the proportion of Li, K, and Na that account for the A-site may be 0.90 or more, 0.95 or more, or 0.98 or more. When the piezoelectric ceramic composition contains Li, for example, piezoelectric properties are improved.

The piezoelectric ceramic composition contains, in addition to Nb, which belongs to group 5 of the periodic table, Ta, which also belongs to group 5, and Sb, which belongs to group 15 (former group 5B) at the B-site. The molar ratio of Ta and Sb to Nb (in another viewpoint, the ratio of the amount of Ta and Sb elements that accounts for the amount of the B-site elements) is relatively small. For example, the molar ratio ((y+z)×(1−β−γ−δ)) of the proportion of Ta and Sb that account for the B-site may be 0.25 or less, 0.20 or less, or 0.16 or less. The ratio of the amount of Nb, Ta, and Sb elements that accounts for the amount of the B-site elements is relatively large. For example, the molar ratio (1-β-γ-δ) of the proportion of Nb, Ta, and Sb that account for the B-site may be 0.90 or more, 0.97 or more, or 0.99 or more. When the piezoelectric ceramic composition contains Ta and/or Sb, for example, piezoelectric properties are improved.

The piezoelectric ceramic composition contains, in addition to K, Na, and Li, Ag and A1 (any metal element) at the A-site. As is understood from the above description of the molar ratios of K, Na, and Li, the ratio (w and α) of the amount of Ag and A1 elements that accounts for the amount of the A-site elements is relatively small. For example, in contrast to the description of the molar ratios of K and other elements, the molar ratio (w+α) of the proportion of Ag and A1 that account for the A-site may be 0.10 or less, 0.05 or less, or 0.02 or less. When the piezoelectric ceramic composition contains Ag and another metal element at the A-site, for example, piezoelectric properties are improved.

The piezoelectric ceramic composition contains, in addition to Nb, Ta, and Sb, B1 (any metal element), B2 (any metal element), and Fe at the B-site. As is understood from the above description of the molar ratios of Nb, Ta, and Sb, the ratio of the amount of B1, B2, and Fe elements that accounts for the amount of the B-site elements is relatively small. For example, in contrast to the description of the molar ratios of Nb and other elements, the molar ratio (β+γ+δ) of the proportion of B1, B2, and Fe that account for the B-site may be 0.10 or less, 0.03 or less, or 0.01 or less. When the piezoelectric ceramic composition contains Fe and other metal elements at the B-site, for example, piezoelectric properties are improved. In addition, Fe contributes to an improvement in the insulation resistance.

A1 may be selected from various metals. A1 may be only a single metal element or a combination a plurality of metal elements. In Examples described later, Bi (bismuth), La (lanthanum), Ce (cerium), Nd (neodymium), and Sm (samarium) are used as examples of A1. Among the above elements, Bi is a metal in group 15 (former group 5B). Metal elements in group 5 or group 15 other than Bi may be used as A1. Among the above elements, La, Ce, Nd, and Sm are lanthanoids. Lanthanoids other than the above may be used as A1.

B1 may be selected from various metals. B1 may be only a single metal element or a combination a plurality of metal elements. In Examples described later, Zn (zinc), Mg (magnesium), Yb (ytterbium), Fe (iron), Cu (copper), Co (cobalt), and Ni (nickel) are used as examples of B1. Among the above elements, Zn, Fe, Cu, Co, and Ni are metal elements in period 4 and are transition metals except for Zn. For example, transition metals in period 4 other than the above may be used as B1. Among the above elements, Yb is a lanthanoid. Lanthanoids other than Yb may be used as B1.

B2 may be selected from various metals. B2 may be only a single metal element or a combination a plurality of metal elements. In Examples described later, Sn (tin), Ti (titanium), Zr (zirconium), Hf (hafnium), Ce (cerium), Ge (germanium), V (vanadium), W (tungsten), Nb (niobium), Sb (antimony), and Ta (tantalum) are used as examples of B2. Among the above elements, elements other than Ce are metal elements in period 4 to period 6 and in group 4 to group 6, group 14 (former group 4B), and group 15 (former group 5B). For example, metal elements (excluding Pb) in period 4 to period 6 and in group 4 to group 6, and group 14 to group 16 (former group 4B to former group 6B) other than the above may be used as B2. Among the above elements, Ce is a lanthanoid. Lanthanoids other than Ce may be used as B2.

The molar ratios (u, v, w, x, y, z, α, β, γ, and δ) may be appropriately determined. An example is as follows: $0.5 \leq u \leq 0.54$, $0 < v \leq 0.06$, $0 < w \leq 0.06$, $0.99 \leq x \leq 1.02$, $0 < y \leq 0.12$, $0 < z \leq 0.1$, $0 < \alpha \leq 0.0275$, $0 < \beta \leq 0.005$, $0 < \gamma \leq 0.005$, and $0 < \delta \leq 0.0125$.

As shown above, v, w, y, z, α, β, γ, and δ are larger than 0. When these values are larger than 0, the effect of adding Li, Ag, Ta, Sb, A1, B1, B2, and Fe to potassium sodium niobate ((K, Na)NbO$_3$) is achieved to some degree. The other lower limits and upper limits are based on Examples described later. When the molar ratios are within the above ranges, for example, the effect of improving piezoelectric properties is achieved.

(Method for Producing Piezoelectric Ceramic Composition)

A method for producing a piezoelectric ceramic composition according to the present embodiment may be the same as a known method for producing a potassium sodium niobate-based piezoelectric ceramic composition except for the types of specific metal elements added to potassium sodium niobate and molar ratios of the metal elements. The method is, for example, as follows.

First, powders of compounds (for example, oxides) of metal elements included in formula (1) are prepared. Examples of such compounds include $K_2CO_3$, $Na_2CO_3$, $Li_2CO_3$, $Ag_2O$, $Nb_2O_5$, $Ta_2O_5$, $Sb_2O_3$, $Fe_2O_3$, $Bi_2O_3$, ZnO, SnO, $SnO_2$, $SrCO_3$, $TiO_2$, and $SrTiO_3$.

Next, the powders of the compounds are measured (for example, weighed) so as to have the composition of formula (1). Next, the measured powders are mixed in an alcohol by using a ball mill (subjected to wet mixing). In the ball mill, for example, $ZrO_2$ balls may be used. The alcohol used may be, for example, IPA (isopropyl alcohol). The mixing time may be, for example, 20 hours or more and 25 hours or less.

Next, after the resulting mixture is dried, calcination of the mixture is performed. The calcination may be performed, for example, in air at a temperature of 900° C. or higher and 1,100° C. or lower for about three hours. The calcined product is then pulverized with a ball mill. Next, a binder is mixed with the pulverized product, and the resulting mixture is granulated. The binder used may be, for example, PVA (polyvinyl alcohol).

Next, the powder after granulation is formed to have any shape and dimensions. The pressure during forming may be, for example, about 200 MPa. The formed body is then fired to obtain a piezoelectric ceramic composition. The firing may be performed, for example, in air at a temperature of 1,000° C. or higher and 1,250° C. or lower for about two hours. Subsequently, the piezoelectric ceramic composition is subjected to polarization treatment by applying an appropriate magnitude of voltage in an appropriate direction and may be used in a piezoelectric actuator or the like.

EXAMPLES

With regard to piezoelectric ceramic compositions according to embodiments, various samples that differ from each other in molar ratios, A1, B1, and B2 were actually produced, and the effect of the composition on properties was examined. FIGS. 1 to 4 are tables showing the results.

In the figures, the column of "No." indicates a sample number. Herein, the composition and properties of 56 types of samples, which are samples 1 to 56, are shown as examples. The columns of "u Na", "v Li", "x A", "w Ag", "y Ta", "z Sb", "α", "β", "γ", and "δ" indicate values of u, v, x, w, y, z, α, β, γ, and δ, respectively, in each sample. The columns of "A1", "B1", and "B2" indicate the types of metal elements of A1, B1, and B2, respectively, in each sample. In the columns of "A1", "B1", and "B2", the symbol "–" indicates that a metal element serving as A1, B1, or B2 was not added and corresponds to α=0, β=0, or γ=0. The column of "Fe" indicates the presence or absence of Fe in each sample. When δ>0, "Fe" is indicated. When δ=0, "–" is indicated. Note that the number of significant digits after the decimal point of each molar ratio is fundamentally the same for the plurality of samples; however, the indication of 0 on the end side is omitted for the sake of convenience.

The column of "d31 pC/N" indicates the value of the piezoelectric constant $d_{31}$ (pC/N) in each sample. Note that $d_{31}$ represents a piezoelectric property in a direction orthogonal to a polarization direction of a piezoelectric ceramic composition when a voltage is applied in the polarization direction. The larger the value of $d_{31}$, the larger the strain generated in response to the intensity of the electric field applied or the larger electric charges generated in response to the pressure applied. In this column, "0" indicates that polarization could not be performed. The column of "R kV/mm" indicates an insulation resistance (kV/mm).

The piezoelectric constant $d_{31}$ was measured by using a piezoelectric ceramic composition after polarization in accordance with a standard (EM-4501A Electrical test methods for piezoelectric ceramic vibrators) specified by JEITA (Japan Electronics and Information Technology Industries Association). More specifically, the piezoelectric constant $d_{31}$ was measured by the resonance-antiresonance method with an impedance analyzer. The insulation resistance was calculated by measuring a leakage current during application of a predetermined voltage to a sample.

Samples 1, 9 to 15, and 26 are samples that do not contain some of the elements represented in formula (1) (that do not satisfy formula (1)). Compared with these samples, samples 2 to 8, 16 to 25, and 27 to 56 that satisfy (1) exhibit, in at least one of the piezoelectric constant $d_{31}$ and the insulation resistance, a higher value than each of the samples that do not satisfy formula (1). Among the samples that do not satisfy (1), samples 9 to 15 have a piezoelectric constant $d_{31}$ of less than 70 (pC/N), and furthermore, in samples 9 to 12, polarization cannot be performed. In contrast, in each of the samples that satisfy formula (1), a value of 70 (pC/N) or more can be ensued as the piezoelectric constant $d_{31}$.

From the above results, it was confirmed that when the composition of a piezoelectric ceramic composition satisfied formula (1), piezoelectric properties were improved. In addition, an example of the range of a molar ratio can be derived from the minimum and the maximum of the molar ratio of the samples that satisfy formula (1). For example, 0.5≤u≤0.54 is derived from samples 16 and 17; 0.02≤v≤0.06 is derived from samples 18 and 19; 0.02≤w≤0.06 is derived from samples 20 and 21; 0.99≤x≤1.02 is derived from samples 29 and 30; 0.02≤y≤0.1 is derived from sample 22 and multiple samples; 0.06≤z≤0.1 is derived from sample 28 and multiple samples; 0.0045≤α≤0.0275 is derived from samples 2 and 7; 0.00125≤β≤0.00187 is derived from multiple samples and sample 45; 0.00063≤γ≤0.00125 is derived from sample 45 and multiple samples; and 0.001≤δ≤0.0125 is derived from samples 2 and 7.

Samples 4 and 51 have the highest value of the piezoelectric constant $d_{31}$ ($d_{31}$=117 pC/N). The insulation resistances of these two samples are higher than the insulation resistance of each of samples 1, 9 to 15, and 26, which do not satisfy formula (1). Furthermore, among samples that satisfy formula (1), sample 4 has a relatively high insulation resistance. FIGS. 1 to 4 show the compositions and properties of samples in which various molar ratios and the types of metal elements are changed by mainly focusing on (with respect to) this sample 4.

Sample 4 is one of samples having the highest properties in view of the piezoelectric constant $d_{31}$ and the insulation resistance. Therefore, the lower limits or upper limits of various molar ratios may be derived (the lower limits or upper limits that have been described above may be modified) by adding or subtracting a predetermined error or an acceptable value of deviation with respect to the values of the molar ratios of sample 4.

For example, in 0.02≤y≤0.1 described above, the upper limit is based on the value of y in sample 4. However, from the properties of samples 22 to 25 (y=0.02 to 0.08) that differ from sample 4 only in value of y, it is obvious that properties equal to or higher than those of samples 4 and 22 to 25 are obtained even if y slightly exceeds 0.1. Accordingly, the upper limit of y may be 0.12 (y≤0.12 may be satisfied).

The values of β and γ are each 0.00125 in sample 4. Furthermore, in other samples that satisfy formula (1), relatively narrow ranges including 0.00125 (0.00167≤β≤0.0125, and 0.00063≤γ≤0.00125) are shown. Meanwhile, B1 related to β and B2 related to γ cause discontinuity in the perovskite structure at the B-site as well as Fe related to δ. Accordingly, the ranges of the values of β and γ may be set with reference to the value of δ. Herein, δ may be a value (sample 2) less than a half of 0.0025 in sample 4 and may be a value (sample 7) five times 0.0025 in sample 4. Accordingly, β and γ may be set to be included in a range of a half of 0.00125 or more and five times 0.00125 or less as well as δ, or in a range narrower than this. For example, 0.001≤β≤0.005 and 0.001≤γ≤0.005 may be satisfied.

Among the above-described samples that satisfy formula (1), samples having particularly high properties may be selected. For example, samples having a piezoelectric constant $d_{31}$ of 90 pC/N or more and an insulation resistance of $1\times10^9$ kV/mm or more may be selected and used. Such samples in FIGS. 1 to 4 are samples 3 to 6, 17, 19 to 21, 23 to 25, 27, 29 to 34, 38 to 43, and 46 to 56.

Samples 4 and 22 to 25 are samples that differ from each other only in value of y related to Ta. As is understood from these samples, an increase in the value of y enables an increase in the value of the piezoelectric constant $d_{31}$. More specifically, when y is changed from 0.02 (sample 22) to 0.04 (sample 23), the value of the piezoelectric constant $d_{31}$ becomes 90 pC/N or more. Accordingly, the piezoelectric ceramic composition may have a composition that satisfies, for example, 0.04≤y≤0.1 (or 0.12).

Samples 1 to 8 are samples that differ from each other in value of α related to A1 and value of δ related to Fe. As is apparent from these samples, an increase in the values of α and δ enables an increase in the insulation resistance. This is probably because the value of δ related to Fe is increased, as is understood from the analysis of a Ta segregation part described later. However, when δ exceeds a certain degree of magnitude (sample 4), the value of the piezoelectric constant $d_{31}$ decreases with an increase in δ. Accordingly, the piezoelectric ceramic composition may have a composition that satisfies, for example, 0.001≤δ≤0.01 ($d_{31}$≥90 pC/N) or 0.00125≤δ≤0.01 ($d_{31}$≥90 pC/N and an insulation resistance of $1\times10^9$ kV/mm or more).

Samples 4 and 16 to 19 are samples that differ from each other in values of u and v. Of these, samples 4 and 17 each have a value of the piezoelectric constant $d_{31}$ larger than the values of the piezoelectric constant $d_{31}$ of samples 16, 18, and 19. Herein, the values of u/v of these samples are as follows: sample 4: 10.48, sample 16: 10, sample 17: 10.8, sample 18: 26.2, and sample 19: about 8.7.

From the above, the range of u/v may be set to, for example, a range that includes the values of u/v of samples 4 and 17 and that does not include the values of u/v of samples 16, 18, and 19. Such a range of the value of u/v may be, for example, 10.1 or more and 26.0 or less, 10.1 or more and 11.0 or less, or 10.48 or more and 10.80 or less.

Samples 4 and 22 to 28 are samples that differ from each other in values of y and z. Of these, samples 4, 24, 25, and 27 each have a value of the piezoelectric constant $d_{31}$ larger than the values of the piezoelectric constant $d_{31}$ of the other samples 22, 23, 26, and 28.

From the above, the ranges of the values of y and z may be set to, for example, ranges that include the values of y and z of the former samples and that do not include the values of y and z of the latter samples. Specifically, the values of z of samples 4, 24, 25, and 27 are in the range of 0.01 or more and 0.09 or less, 0.05 or more and 0.09 or less, or 0.06 or more and 0.08 or less. The values of y/z of samples 4, 24, 25, and 27 are in the range of 0.7 or more and 10 or less, 0.9 or more and 1.8 or less, or 1.0 or more and 1.67 or less. Samples 22, 23, 26, and 28 do not satisfy at least one of the range of z and the range of y/z.

Samples 4 and 31 to 52 are samples that differ from each other in metal elements used as B1 and B2. Of these, samples 4, 33, 34, 38 to 40, 42, 43, and 46 to 52 each have a value of the piezoelectric constant $d_{31}$ larger than the values of the piezoelectric constant $d_{31}$ of the other samples 31, 32, 35 to 37, 41, 44, and 45.

From the above, metal elements of the former samples may be selected as B1 and B2. Specifically, B1 may be any one of Zn, Mg, Fe, Cu, Co, and Ni. In addition or alternatively, B2 may be any one of Sn, Ti, Zr, Hf, Ge, Nb, Sb, and Ta.

(Ta Segregation Part)

Figure 5:
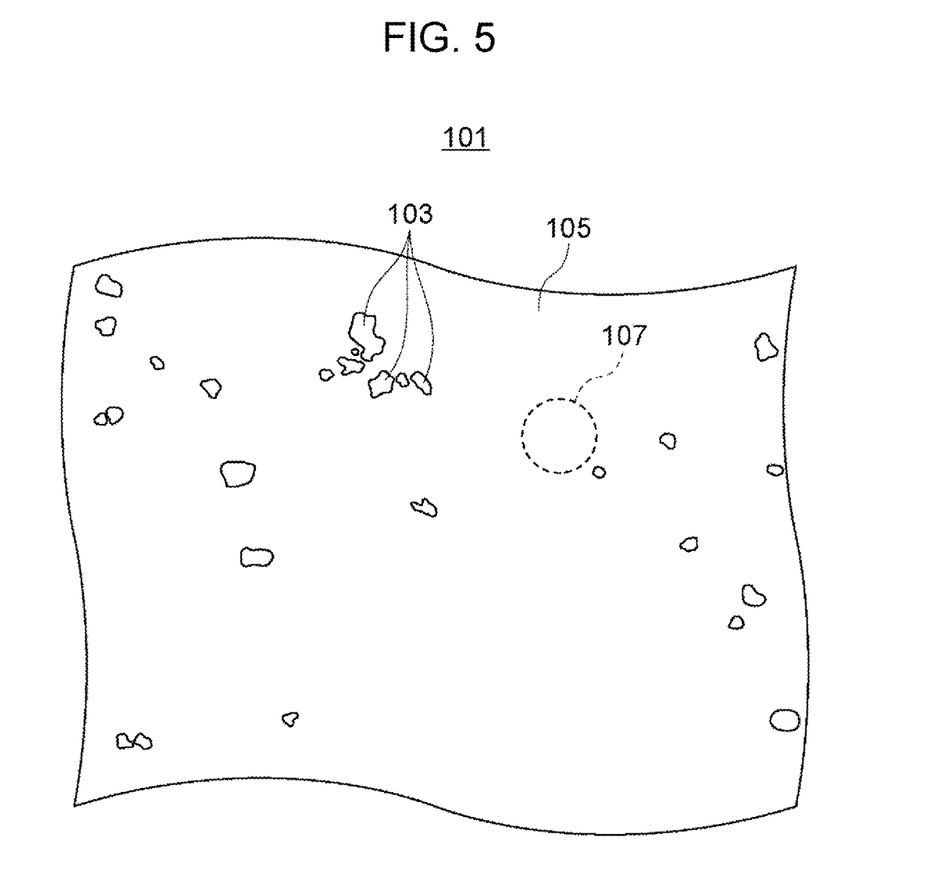
FIG. 5 is a schematic view for explaining Ta segregation parts.

FIG. 5 is a schematic view of an image (hereinafter, TEM image) of a section of a piezoelectric ceramic composition 101, the image being obtained with a transmission electron microscope (TEM).

In the piezoelectric ceramic composition 101, a Ta segregation part 103 in which Ta is unevenly distributed may be generated. Such a Ta segregation part 103 is visually recognized, for example, as a region whiter than the other region in a TEM image. In the TEM image, the boundary between the Ta segregation part 103 and the other region is relatively clear, and the two regions can be distinguished from each other (the range of the Ta segregation part 103 can be specified) by visual observation.

The Ta segregation part 103 may be defined by a presence ratio of Ta. For example, a region where a ratio calculated by dividing the amount of Ta element by the amount of Nb element (hereinafter, may be represented by "Ta/Nb" for the sake of convenience, which also applies to other elements) is 0.5 or more may be defined as the Ta segregation part 103.

In the piezoelectric ceramic composition 101, a part other than the Ta segregation part 103 is referred to as a non-Ta segregation part 105. The differences in composition and properties between the Ta segregation part 103 and the non-Ta segregation part 105 will be described below.

When a region where Ta/Nb is 0.5 or more is defined as the Ta segregation part 103, a region that does not meet the definition of the Ta segregation part 103 but has a relatively high Ta/Nb may be present around the Ta segregation part 103. Such a region is not suitable for a target for comparison with the Ta segregation part 103. Accordingly, a reference part 107 serving as a portion of the non-Ta segregation part 105 may be defined as a comparison target.

The reference part 107 may be, for example, a region where Ta/Nb is equal to or less than y/(1−y−z) of formula (1). When raw powders are measured in order to produce a piezoelectric ceramic composition 101, Ta/Nb is adjusted to y/(1−y−z) represented in formula (1). In another viewpoint, Ta/Nb becomes y/(1−y−z) as an average value in the whole piezoelectric ceramic composition 101. However, as a result of the formation of the Ta segregation part 103, Ta/Nb becomes larger than y/(1−y−z) in the Ta segregation part 103. Furthermore, with this formation, Ta/Nb becomes slightly smaller than y/(1−y−z) as a whole (on the average) in the non-Ta segregation part 105. Accordingly, a region where Ta/Nb is equal to or less than y/(1−y−z) may be defined as the reference part 107.

The grain size and the area of the Ta segregation part 103 may be appropriate sizes. For example, a plurality of Ta segregation parts 103 includes a Ta segregation part having a grain size of 0.1 μm or more. A Ta segregation part 103 having a grain size of about 0.5 μm is observed in some cases. Note that the grain size is an equivalent circle diameter and may be calculated on the basis of a sectional image. In any cross section of the piezoelectric ceramic composition 101, a ratio of the area occupied by a plurality of Ta segregation parts 103 is, for example, 1% or more. As a matter of course, the ratio of the area occupied by a plurality of Ta segregation parts 103 may be less than 1%.

(Composition of Ta Segregation Part)

Figure 1:
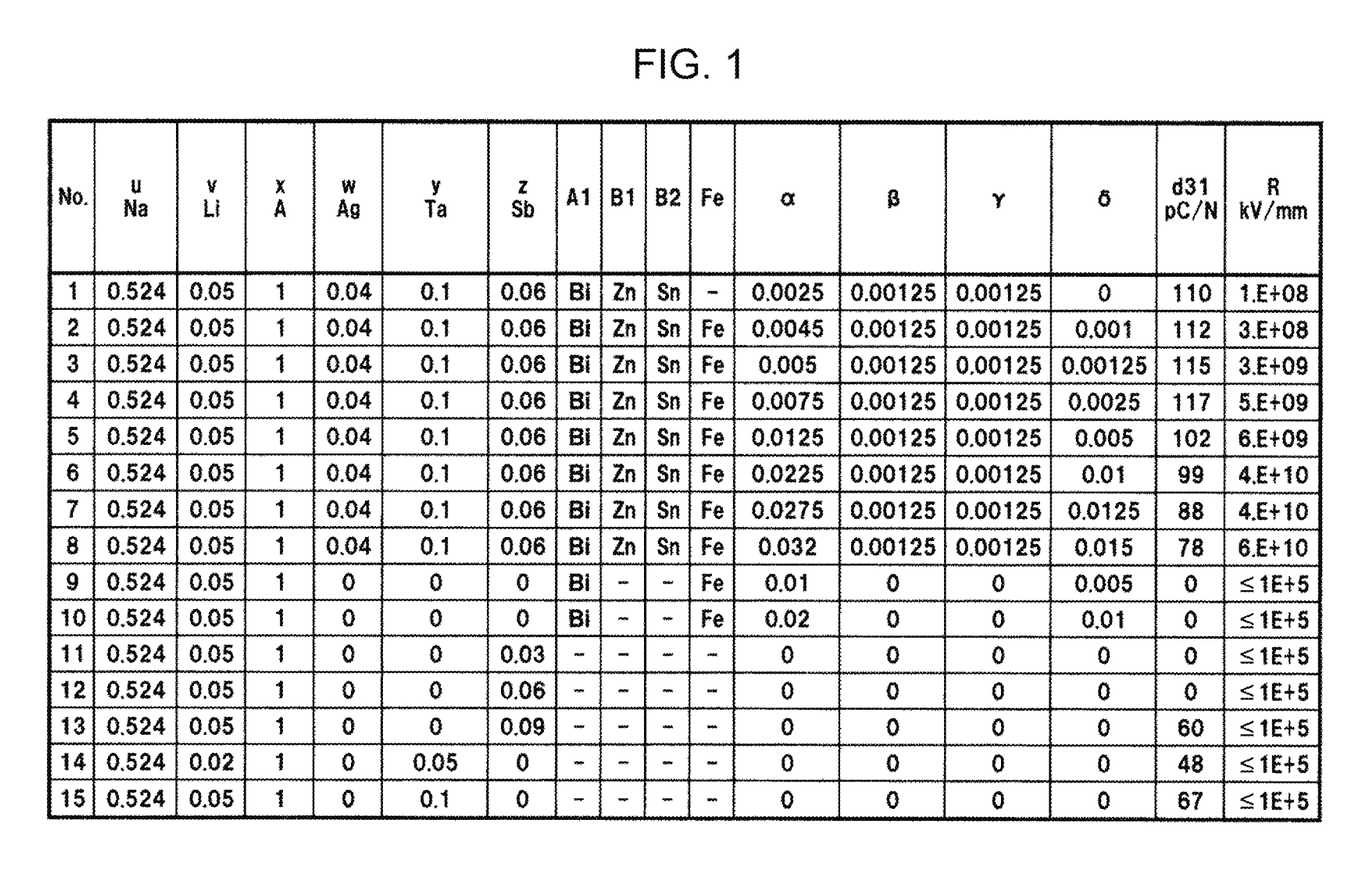
FIG. 1 is a table showing compositions and properties of samples 1 to 15 according to piezoelectric ceramic compositions.
Figure 2:
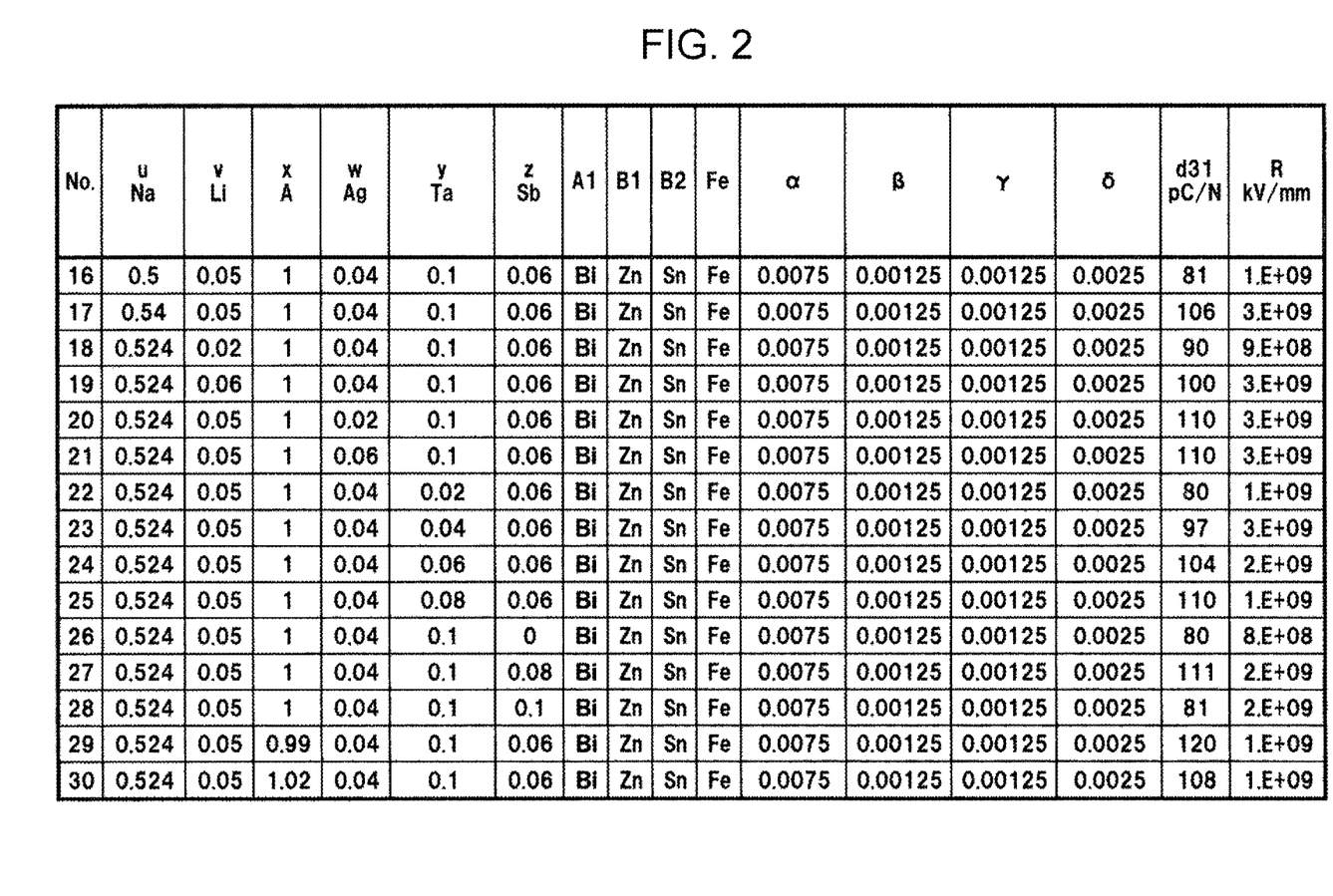
FIG. 2 is a table showing compositions and properties of samples 16 to 30 according to piezoelectric ceramic compositions.
Figure 3:
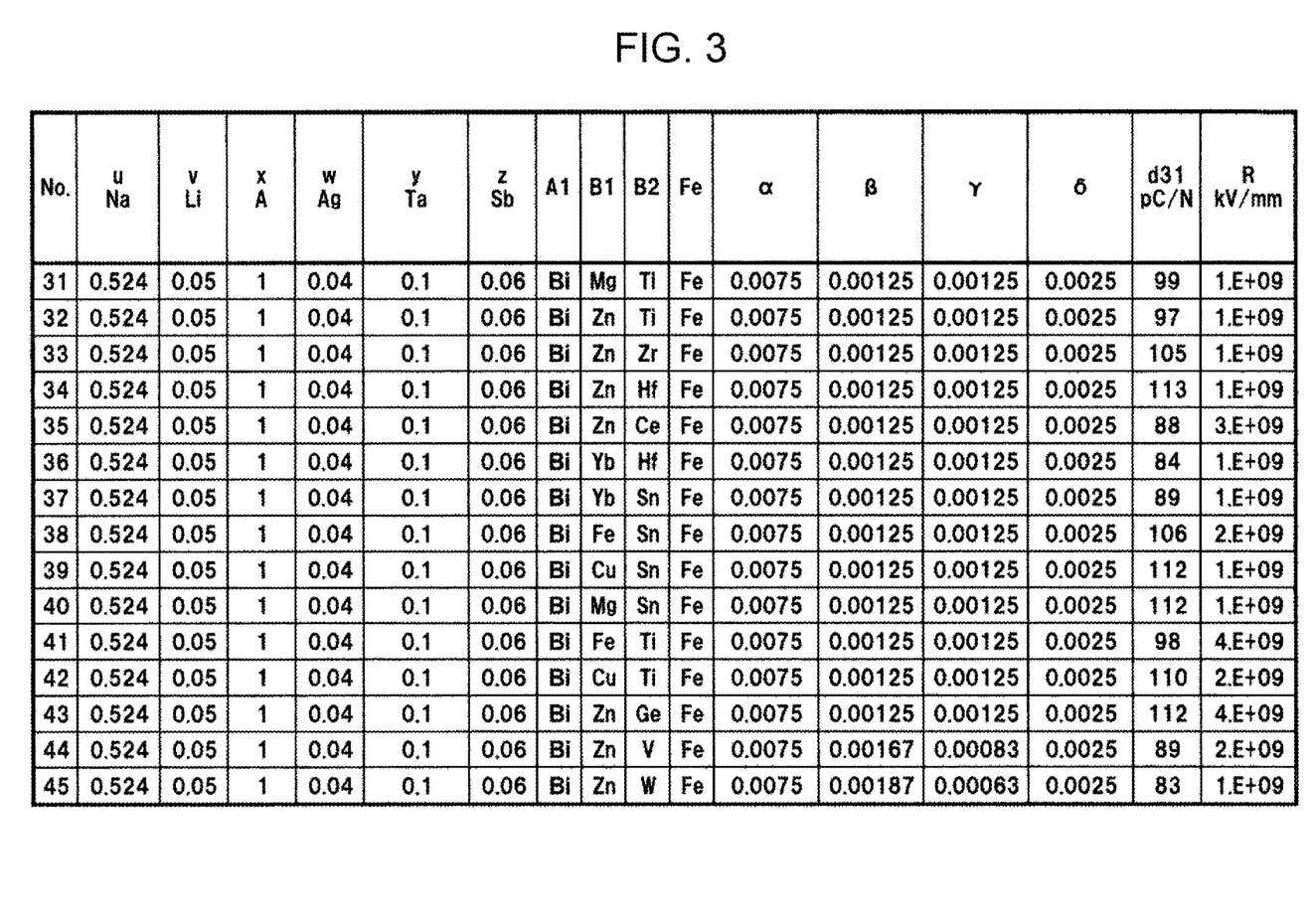
FIG. 3 is a table showing compositions and properties of samples 31 to 45 according to piezoelectric ceramic compositions.
Figure 4:
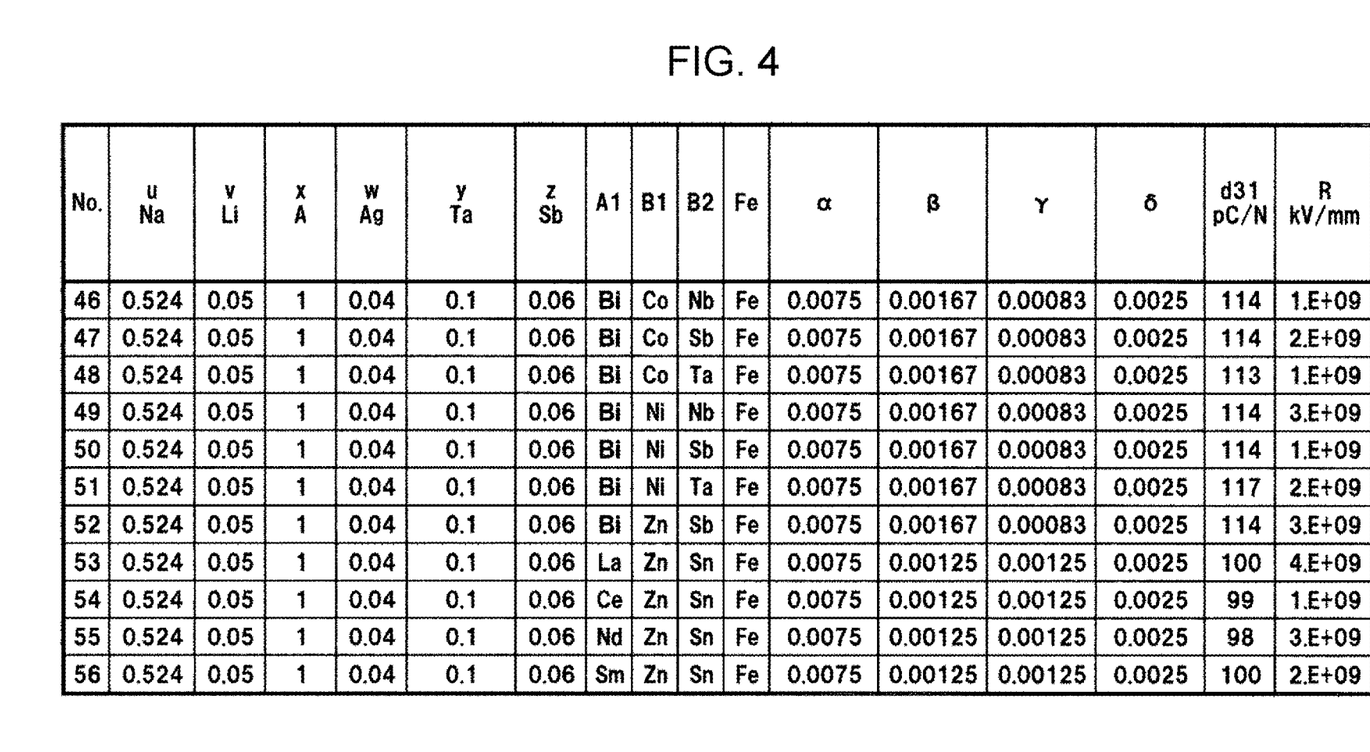
FIG. 4 is a table showing compositions and properties of samples 46 to 56 according to piezoelectric ceramic compositions.
Figure 6:
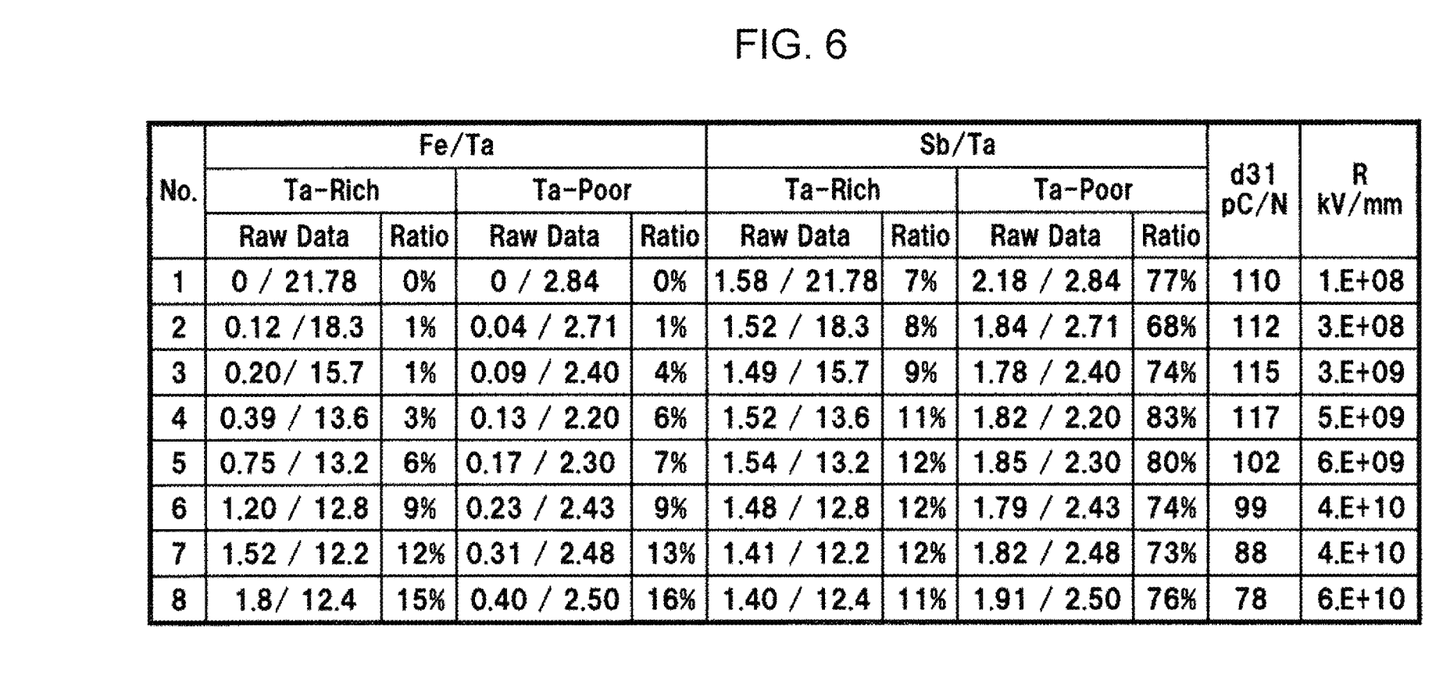
FIG. 6 is a table showing component ratios in Ta segregation parts.

FIG. 6 is a graph showing the results obtained by examining the compositions and properties of a Ta segregation part 103 and a non-Ta segregation part 105 in samples 1 to 8 shown in FIG. 1.

In the figure, the indications of the columns of "No.", "d31 pC/N", and "R kV/mm" and specific values shown in the columns are the same as those in FIG. 1.

The column of "Fe/Ta" indicates molar ratios of Fe to Ta. The column of "Ta-Rich" indicates the molar ratio in the Ta segregation part 103. The column of "Ta-Poor" indicates the molar ratio in the non-Ta segregation part 105 (reference part 107). The column of "Raw Data" indicates, among values of raw data showing a relative amount of each element in a region of an analysis target (the ratio of the amount of each element to the amount of all elements), a value regarding Fe and a value regarding Ta in such a manner that the two values are separated by "/". The column of "Ratio" indicates the value of Fe/Ta (molar ratio) using the value in the column of "Raw Data" in percentage.

The column of "Sb/Ta" indicates, with regard to molar ratios of Sb to Ta, values similar to those in the column of "Fe/Ta".

The analysis for obtaining the numerical values in FIG. 6 was performed as follows. First, a sample having a size of several micrometers to several tens of micrometers is sampled from a piezoelectric ceramic composition by using an FIB (focused ion beam) apparatus. From the sampled portion, a region having a width of 10 μm and a height of 10 μm is processed to have a thickness of about 0.12 μm to 0.05 μm. The resulting sample after processing is observed with a TEM. The TEM used was JEM-2010F manufactured by JEOL Ltd. The acceleration voltage was 200 kV. Grains, grain boundary faces, and the inside of the grains were grasped while comparing a transmission electron image and a STEM (scanning TEM) image. Specifically, Ta segregation parts 103 and a non-Ta segregation part 105 were distinguished from each other. Each portion was then subjected to EDX analysis (energy dispersive X-ray spectrometry). The EDX apparatus used was JED-2300T manufactured by JEOL Ltd.

As is understood from the above description, in FIG. 6, a Ta segregation part 103 and a non-Ta segregation part 105 are distinguished from each other by visual observation. However, it has been confirmed that, in the EDX analysis for obtaining FIG. 6, Ta/Nb is 0.5 or more in the Ta segregation part 103 serving as the analysis target, and Ta/Nb is y/(1−y−z) or less in the non-Ta segregation part 105 (reference part 107) serving as the analysis target.

(Effect of Fe)

In "Fe/Ta" of FIG. 6, as is understood from the comparison between "Raw Data" in "Ta-Rich" and "Raw Data" in "Ta-Poor", the Fe content (the ratio of the amount of Fe element to the amount of all elements) in the Ta segregation part 103 is higher than that in the non-Ta segregation part 105. For example, except for sample 1 in which Fe is not added (δ=0), the Fe content in the Ta segregation part 103 is two times or more and six times or less the Fe content in the non-Ta segregation part 105.

In "Fe/Ta" of FIG. 6, as is understood from the comparison between "Ratio" in "Ta-Rich" and "Ratio" in "Ta-Poor", Fe/Ta (molar ratio) in the Ta segregation part 103 is smaller than that in the non-Ta segregation part 105. For example, except for sample 1 in which Fe is not added (δ=0), Fe/Ta in the non-Ta segregation part 105 is more than one time and three times or less Fe/Ta in the Ta segregation part 103.

As is understood from FIG. 1, in samples 1 to 8, a sample having a larger sample number has a higher molar ratio (δ) of Fe as the whole piezoelectric ceramic composition. Similarly, in each of the Ta segregation part 103 and the non-Ta segregation part 105, the Fe content and Fe/Ta increase with an increase in the sample number.

In samples 2 to 7 among samples 1 to 8, Fe/Ta is 1% or more and 12% or less (the number after the decimal point of the value is rounded to the nearest integer). In samples 3 to 6 among the samples, Fe/Ta is 1% or more and 9% or less (the number after the decimal point of the value is rounded to the nearest integer). As is understood from the columns of "d31 pC/N" and "R kV/mm", when the value of Fe/Ta is within these ranges, a certain degree of magnitude is ensured for each of the piezoelectric constant $d_{31}$ and the insulation resistance.

(Effect of Sb)

In "Sb/Ta" of FIG. 6, as is understood from the comparison between "Raw Data" in "Ta-Rich" and "Raw Data" in "Ta-Poor", the Sb content (the ratio of the amount of Sb element to the amount of all elements) in the Ta segregation part 103 is lower than that in the non-Ta segregation part 105. For example, the Sb content in the non-Ta segregation part 105 is 1.1 times or more and 1.4 times or less the Sb content in the Ta segregation part 103.

In "Sb/Ta" of FIG. 6, as is understood from the comparison between "Ratio" in "Ta-Rich" and "Ratio" in "Ta-Poor", Sb/Ta (molar ratio) in the Ta segregation part 103 is smaller than that in the non-Ta segregation part 105. For example, Sb/Ta in the non-Ta segregation part 105 is 6 times or more and 11 times or less Sb/Ta in the Ta segregation part 103.

As is understood from FIG. 1, in samples 1 to 8, the values of the molar ratio (z) of Sb as the whole piezoelectric ceramic composition are equal to each other. However, with an increase in the molar ratio (δ) of Fe, Sb/Ta in the Ta segregation part 103 tends to increase.

In samples 2 to 7 among samples 1 to 8, Sb/Ta is 8% or more and 12% or less (the number after the decimal point of the value is rounded to the nearest integer). In samples 3 to 6 among the samples, Sb/Ta is 9% or more and 12% or less (the number after the decimal point of the value is rounded to the nearest integer). As is understood from the columns of "d31 pC/N" and "R kV/mm", when the value of Sb/Ta is within these ranges, a certain degree of magnitude is ensured for each of the piezoelectric constant $d_{31}$ and the insulation resistance.

When Ta is contained in a mixture of a raw powders, Ta segregation parts 103 are formed, and a molar ratio of a metal element that is likely to be bound to Ta becomes relatively large in the Ta segregation parts 103. In other words, for example, when a piezoelectric ceramic composition is produced so as to realize the composition of formula (1), Ta segregation parts 103 are formed, and molar ratios the same as the molar ratios shown in FIG. 6 are realized. However, if the piezoelectric ceramic composition is not sufficiently densified and the Ta segregation parts 103 have small grain sizes, other grains are also visible, and it is difficult to specify the Ta segregation parts 103 by visual observation.

As described above, the piezoelectric ceramic composition according to the present embodiment is represented by a composition formula $A_xBO_3$ and includes potassium sodium niobate containing K and Na that account for 80% or more of the amount of A-site elements and containing Nb that accounts for 70% or more of the amount of B-site elements. This piezoelectric ceramic composition contains Ta and Fe at a B-site.

As is understood from samples 4, 9 to 14, and 22 to 25, which differ from each other in molar ratio of Ta, when Ta is contained in the piezoelectric ceramic composition, for example, the value of the piezoelectric constant $d_{31}$ is increased. That is, piezoelectric properties are improved. On the other hand, as is understood from samples 23 to 25, when Ta is contained in the piezoelectric ceramic composition, the insulation resistance is decreased in some cases. However, as is understood from samples 1 to 8 containing Ta and having Fe molar ratios that are different from each other, when Fe is contained in the piezoelectric ceramic composition, the decrease in the insulation resistance can be compensated for.

In the present embodiment, the piezoelectric ceramic composition may be represented by formula (1) described above. A1 in formula (1) may be Bi, La, Ce, Nd, or Sm or a combination thereof. B1 in formula (1) may be Zn, Mg, Yb, Fe, Cu, Co, or Ni or a combination thereof. B2 in formula (1) may be Sn, Ti, Zr, Hf, Ce, Ge, V, W, Nb, Sb, or Ta or a combination thereof.

In such a composition, for example, as shown in FIGS. 1 to 4, when Ta and Fe are contained in the piezoelectric ceramic composition, each of the value of the piezoelectric constant $d_{31}$ and the insulation resistance is likely to be ensured to a certain degree of magnitude. Furthermore, when the piezoelectric ceramic composition is a potassium sodium lithium niobate-based composition among potassium sodium niobate-based compositions, piezoelectric properties are improved.

In the present embodiment, the following inequalities may be satisfied: $0.500 \leq u \leq 0.540$, $0.00 < v \leq 0.06$, $0.00 < w \leq 0.06$, $0.99 \leq x \leq 1.02$, $0.00 < y \leq 0.12$, $0.00 < z \leq 0.10$, $0.0000 < \alpha \leq 0.0275$, $0.000 < \beta \leq 0.005$, $0.000 < \gamma \leq 0.005$, and $0.0000 < \delta \leq 0.0125$.

When the molar ratios satisfy the above ranges, for example, as described with reference to FIGS. 1 to 4, each of the value of the piezoelectric constant $d_{31}$ and the insulation resistance is likely to be ensured to a certain degree of magnitude.

In particular, when A1 is Bi (bismuth), B1 is Zn (zinc), and B2 is Sn (tin), the following formulae may be satisfied: $0.524 \leq u \leq 0.540$, $0.05 \leq v \leq 0.06$, $0.02 \leq w \leq 0.06$, $0.99 \leq x \leq 1.02$, $0.04 \leq y \leq 0.10$, $0.06 \leq z \leq 0.08$, $0.0050 \leq \alpha \leq 0.0125$, $0.000 < \beta \leq 0.005$, $\beta = \gamma$, and $0.00125 \leq \delta \leq 0.01000$. When the above formulae are satisfied, a piezoelectric constant $d_{31}$ of 90 (more specifically, 97) pC/N or more and an insulation resistance R of $1 \times 10^9$ kV/mm or more are ensured, and both piezoelectric properties and insulating properties can be improved.

A1 may be La (lanthanum), Ce (cerium), Nd (neodymium), or Sm (samarium) instead of Bi (bismuth). The above effect is also obtained in this case. When B2 is Sn (tin) and B1 is Fe (iron), Cu (copper), or Mg (magnesium) instead of Zn (zinc), the above effect is also obtained. When B1 is Zn (zinc) and B2 is Ti (titanium), Zr (zirconium), Hf (hafnium), or Ge (germanium) instead of Sn (tin), the above effect is also obtained. In a case of a combination in which B2 is Ti (titanium) and B1 is Mg (magnesium), Fe (iron), or Cu (copper), the above effect is also obtained.

Furthermore, when A1 is Bi (bismuth), B1 is Co (cobalt), Ni (nickel), or Zn (zinc), B2 is Nb (niobium), Sb (antimony), or Ta (tantalum), and the value of β is almost twice the value of γ, the above effect is also obtained.

In the present embodiment, the piezoelectric ceramic composition may have a Ta segregation part 103 in which Ta is unevenly distributed. The ratio of the amount of Fe element to the amount of all elements in the Ta segregation part 103 may be larger than the ratio of the amount of Fe element to the amount of all elements in a reference part 107 which is at least a portion of a part (non-Ta segregation part 105) different from the Ta segregation part 103.

In this case, for example, in the Ta segregation part 103 where Ta, which causes a decrease in the insulation resistance, is unevenly distributed, the content of Fe, which reduces the decrease in the insulation resistance, becomes relatively large. As a result, the decrease in the insulation resistance can be efficiently reduced.

In the present embodiment, the Ta segregation part 103 may be a part in which a ratio (Ta/Nb) calculated by dividing the amount of Ta element by the amount of Nb element is 0.5 or more.

The formation of such a Ta segregation part 103 has been confirmed by EDX for obtaining FIG. 6. When such a Ta segregation part 103 is formed, for example, the compositions and properties shown in FIG. 6, etc., are easily obtained. In addition, for example, when the Ta segregation part 103 is defined as described above, even in a situation where it is difficult to specify the Ta segregation part 103 by visual observation, the Ta segregation part 103 is specified objectively (without arbitrariness), and the composition of the Ta segregation part can be analyzed.

In the present embodiment, the reference part 107 may be a part in which a ratio calculated by dividing the amount of Ta element by the amount of Nb element is $y/(1-y-z)$ or less.

When a region that is compared with the Ta segregation part 103 is defined in this manner, for example, the comparison between the composition of the Ta segregation part 103 and the composition of the non-Ta segregation part 105 can be performed objectively (without arbitrariness).

In the present embodiment, a ratio (Fe/Ta) calculated by dividing the amount of Fe element by the amount of Ta element in the Ta segregation part 103 may be smaller than the ratio calculated by dividing the amount of Fe element by the amount of Ta element in the reference part 107.

In this case, for example, while the Fe content in the Ta segregation part 103 is high, the Fe content in the non-Ta segregation part 105 can also be ensured to a certain degree to achieve the effect of increasing the insulation resistance. Consequently, for example, the insulation resistance can be increased in a balanced manner as a whole.

In the present embodiment, the ratio (Fe/Ta) calculated by dividing the amount of Fe element by the amount of Ta element in the Ta segregation part 103 may be 0.01 or more and 0.12 or less (the value is rounded to two decimal places).

In this case, for example, as is understood from the values of samples 2 to 7 in FIG. 6, a certain degree of magnitude is easily ensured for each of the piezoelectric constant $d_{31}$ and the insulation resistance. For example, it is expected that a piezoelectric constant $d_{31}$ of 80 (pC/N) or more is ensured and that an insulation resistance value of $3 \times 10^8$ kV/mm or more is ensured.

In the present embodiment, the ratio (Fe/Ta) calculated by dividing the amount of Fe element by the amount of Ta element in the Ta segregation part 103 may be 0.01 or more and 0.09 or less (the value is rounded to two decimal places).

In this case, for example, as is understood from the values of samples 3 to 6 in FIG. 6, a certain degree of magnitude is easily ensured for each of the piezoelectric constant $d_{31}$ and the insulation resistance. For example, it is expected that a piezoelectric constant $d_{31}$ of 90 (more specifically, 99) pC/N or more is ensured and that an insulation resistance value of $1 \times 10^9$ (more specifically, $3 \times 10^9$) kV/mm or more is ensured.

In this case, the ratio (Fe/Ta) calculated by dividing the amount of Fe element by the amount of Ta element in the non-Ta segregation part 105 may be 0.04 or more and 0.09 or less (the value is rounded to two decimal places).

In the present embodiment, the piezoelectric ceramic composition may contain Sb at the B-site. The ratio (Sb/Ta) calculated by dividing the amount of Sb element by the amount of Ta element in the Ta segregation part 103 may be smaller than the ratio calculated by dividing the amount of Sb element by the amount of Ta element in the reference part 107.

As is understood from samples 4 and 26 to 28, which differ from each other in molar ratio (z) of Sb in the whole piezoelectric ceramic composition, Sb can contribute to ensuring both the values of the piezoelectric constant $d_{31}$ and the insulation resistance. However, an excessively high molar ratio of Sb reduces the effect. This is probably because the ratio of the total amount of Ta and Sb elements that accounts for the amount of the B-site elements is excessively increased, and a part where Nb is discontinuous is excessively increased. Accordingly, by relatively decreasing Sb/Ta in the Ta segregation part 103, each of the values of the piezoelectric constant $d_{31}$ and insulation resistance is easily ensured to a certain degree of magnitude.

In the present embodiment, the ratio (Sb/Ta) calculated by dividing the amount of Sb element by the amount of Ta element in the Ta segregation part 103 may be 0.08 or more and 0.12 or less (the value is rounded to two decimal places).

In this case, for example, as is understood from the values of samples 2 to 7 in FIG. 6, a certain degree of magnitude is easily ensured for each of the piezoelectric constant $d_{31}$ and the insulation resistance. For example, it is expected that a piezoelectric constant $d_{31}$ of 80 (pC/N) or more is ensured and that an insulation resistance value of $3 \times 10^8$ kV/mm or more is ensured.

In the present embodiment, the ratio (Sb/Ta) calculated by dividing the amount of Sb element by the amount of Ta element in the Ta segregation part 103 may be 0.09 or more and 0.12 or less (the value is rounded to two decimal places).

In this case, for example, as is understood from the values of samples 3 to 6 in FIG. 6, a certain degree of magnitude is easily ensured for each of the piezoelectric constant $d_{31}$ and the insulation resistance. For example, it is expected that a piezoelectric constant $d_{31}$ of 90 (more specifically, 99) pC/N or more is ensured and that an insulation resistance value of $1 \times 10^9$ (more specifically, $3 \times 10^9$) kV/mm or more is ensured.

In this case, the ratio (Sb/Ta) calculated by dividing the amount of Sb element by the amount of Ta element in the non-Ta segregation part 105 may be 0.74 or more and 0.83 or less (the value is rounded to two decimal places).

In the present embodiment, the piezoelectric ceramic composition may have a cross section in which a ratio of the area occupied by Ta segregation parts 103 is 1% or more. In addition or alternatively, the piezoelectric ceramic composition may include a Ta segregation part 103 having a grain size of 0.1 μm or more.

In such a piezoelectric ceramic composition, the Ta segregation parts 103 exert a relatively large influence on the properties of the piezoelectric ceramic composition. Accordingly, the effect of increasing the insulation resistance effectively works when, for example, the content and/or the range of the molar ratio of Fe and/or Sb described above is satisfied.

Application Example

Figure 7:
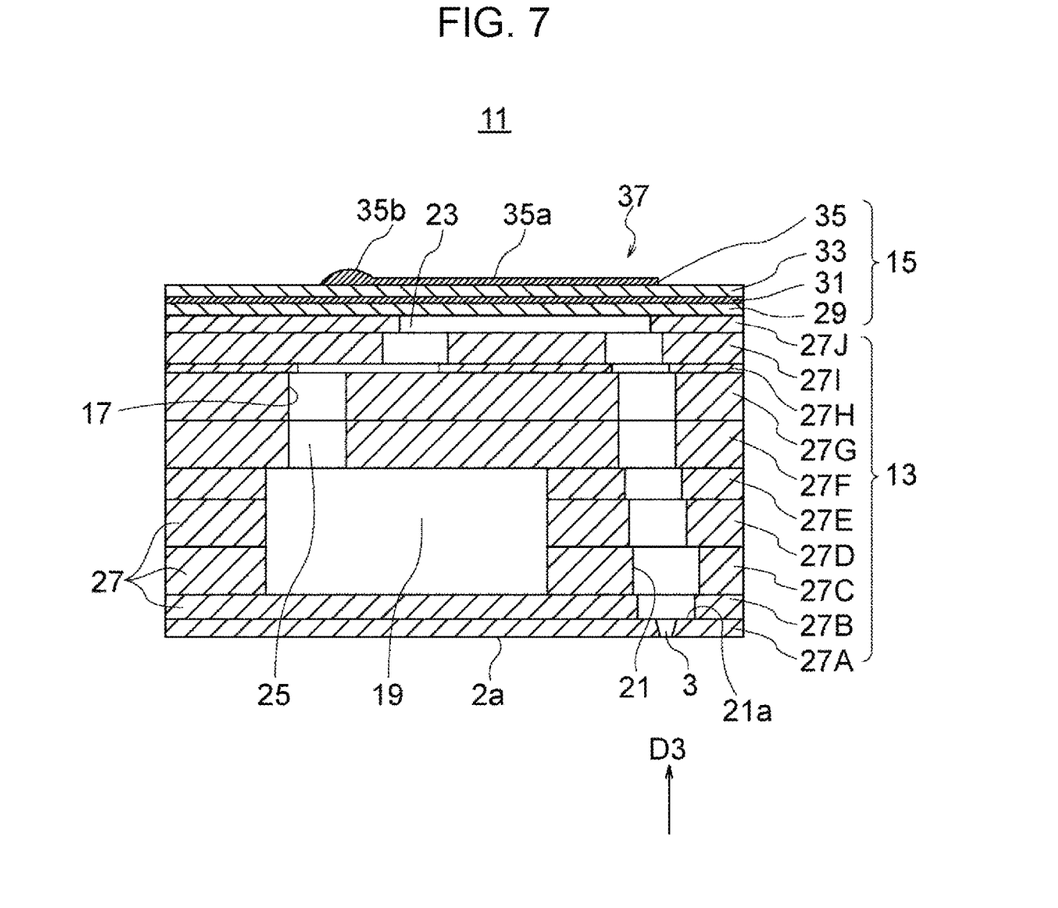
FIG. 7 is a sectional view illustrating an example of a piezoelectric actuator.

FIG. 7 is a sectional view illustrating an application example of a piezoelectric ceramic composition. This sectional view illustrates a part of an ink jet head 11. The lower part (−D3 side) of the sheet of FIG. 7 is a side on which a recording medium (for example, paper) is disposed.

The head 11 is, for example, a substantially plate-like member and includes a plurality of structures illustrated in FIG. 7 along a plane orthogonal to the D3 axis. The head 11 has a thickness (in the D3 direction) of, for example, 0.5 mm or more and 2 mm or less. A plurality of ejection holes 3 (only one ejection hole is illustrated in FIG. 7) through which droplets are ejected opens in an ejection surface 2a of the head 11 facing the recording medium. The plurality of ejection holes 3 is two-dimensionally arranged along the ejection surface 2a.

The head 11 is a piezoelectric head configured to apply a pressure to a liquid by mechanical strain of a piezoelectric element to eject a droplet. The head 11 includes a plurality of ejection elements 37 each having ejection holes 3. In FIG. 7, one ejection element 37 is illustrated. The plurality of ejection elements 37 is two-dimensionally arranged along the ejection surface 2a.

In another viewpoint, the head 11 includes a plate-like flow channel member 13 having flow channels through which a liquid (ink) flows, and an actuator substrate 15 (an example of a piezoelectric actuator) configured to apply a pressure to the liquid in the flow channel member 13. Each of the plurality of ejection elements 37 is formed by the flow channel member 13 and the actuator substrate 15. The ejection surface 2a is formed by the flow channel member 13.

The flow channel member 13 has a common flow channel 19 and a plurality of individual flow channels 17 (one individual flow channel is illustrated in FIG. 7) each connected to the common flow channel 19. Each of the individual flow channels 17 has the ejection hole 3 described above and has a connection flow channel 25, a pressurization chamber 23, and a partial flow channel 21 in this order from the common flow channel 19 to the ejection hole 3. The pressurization chamber 23 opens in a surface of the flow channel member 13, the surface being opposite to the ejection surface 2a. The partial flow channel 21 extends from the pressurization chamber 23 toward the ejection surface 2a. The ejection hole 3 opens in a bottom surface 21a of the partial flow channel 21.

The plurality of individual flow channels 17 and the common flow channel 19 are filed with a liquid. The volumes of a plurality of pressurization chambers 23 are changed to apply a pressure to the liquid. The liquid is thereby sent from the plurality of pressurization chambers 23 to a plurality of partial flow channels 21, and a plurality of droplets is ejected from the plurality of ejection holes 3. The plurality of pressurization chambers 23 is replenished with the liquid from the common flow channel 19 through a plurality of connection flow channels 25.

The flow channel member 13 is formed by, for example, stacking a plurality of plates 27A to 27J (hereinafter, A to J may be omitted). A plurality of holes (which is mainly through-holes or may be recesses) that forms a plurality of individual flow channels 17 and a common flow channel 19 is formed in the plates 27. The thicknesses and the number of the plurality of plates 27 stacked may be appropriately determined in accordance with, for example, the shapes of the plurality of individual flow channels 17 and the common flow channel 19. The plurality of plates 27 may be formed of an appropriate material. For example, the plurality of plates 27 is formed of a metal or a resin. The plates 27 each have a thickness of, for example, 10 μm or more and 300 μm or less.

The actuator substrate 15 has a substantially plate shape having an area throughout the plurality of pressurization chambers 23. The actuator substrate 15 is formed by a so-called unimorph piezoelectric actuator. The actuator substrate 15 may be formed by another piezoelectric actuator such as a bimorph piezoelectric actuator. The actuator substrate 15 includes, for example, a vibration plate 29, a common electrode 31, a piezoelectric layer 33, and an individual electrode 35 in this order from the flow channel member 13 side.

The vibration plate 29, the common electrode 31, and the piezoelectric layer 33 extend over the plurality of pressurization chambers 23 in plan view. Specifically, these are provided for the plurality of pressurization chambers 23 in common. The individual electrode 35 is provided for each pressurization chamber 23. The individual electrode 35 includes a body 35a that overlaps the pressurization chamber 23 and an extension electrode 35b extending from the body 35a. The extension electrode 35b contributes to connection to a signal line (not illustrated).

The piezoelectric layer 33 is formed of, for example, a piezoelectric ceramic composition according to the present embodiment. A portion of the piezoelectric layer 33 disposed between the individual electrode 35 and the common electrode 31 is polarized in the thickness direction. Accordingly, for example, when an electric field (voltage) is applied in the polarization direction of the piezoelectric layer 33 by the individual electrode 35 and the common electrode 31, the piezoelectric layer 33 contracts in the direction along the piezoelectric layer 33. This contraction is controlled by the vibration plate 29. As a result, the actuator substrate 15 bends and deforms to become convex toward the pressurization chamber 23 side. Furthermore, the volume of the pressurization chamber 23 is reduced, and a pressure is applied to the liquid in the pressurization chamber 23. When an electric field (voltage) is applied in a direction opposite to the above-described direction by the individual electrode 35 and the common electrode 31, the actuator substrate 15 bends and deforms toward the side opposite to the pressurization chamber 23.

The thickness, the material, and the like of each of the layers that form the actuator substrate 15 may be appropriately determined. As one example, the thicknesses of the vibration plate 29 and the piezoelectric layer 33 may each be 10 μm or more and 40 μm or less. The thickness of the common electrode 31 may be 1 μm or more and 3 μm or less. The thickness of the individual electrode 35 may be 0.5 μm or more and 2 μm or less. The material of the vibration plate 29 may be a ceramic material that has piezoelectricity or that does not have piezoelectricity. The material of the common electrode 31 may be a metal material such as a Ag—Pd-based material. The material of the individual electrode 35 may be a metal material such as a Au-based material.

The technology according to the present disclosure is not limited to the above embodiments and may be implemented in various forms.

For example, the piezoelectric ceramic composition is not limited to a composition represented by formula (1). As shown in samples 14 and 15, even in potassium sodium niobate-based piezoelectric ceramic compositions that do not satisfy formula (1), the value of the piezoelectric constant $d_{31}$ is increased by addition of Ta. Furthermore, as described in the embodiment, an increase in the insulation resistance due to the addition of Fe occurs probably because Fe is interposed between Ta elements. Accordingly, it is assumed that even in a composition other than the composition represented by formula (1), the effect of balancing both the values of the piezoelectric constant $d_{31}$ and the insulation resistance is achieved to some degree by adding Ta and Fe to potassium sodium niobate.

The piezoelectric ceramic composition may be used in sensors, vibrators, filters, or the like besides actuators. The actuators are not limited to those used in ink jet heads but may be actuators used in various devices.

The invention claimed is:

1. A piezoelectric ceramic composition represented by a composition formula $A_xBO_3$, the piezoelectric ceramic composition comprising:
   potassium sodium niobate containing K and Na that account for 80% or more of an amount of A-site elements and containing Nb that accounts for 70% or more of an amount of B-site elements,
   wherein the piezoelectric ceramic composition comprises Ta and Fe at a B-site,
   wherein the piezoelectric ceramic composition is represented by a composition formula $\{(K_{1-u-v}Na_uLi_v)_{1-w-\alpha}Ag_wAl_\alpha\}_x\{(Nb_{1-y-z}Ta_ySb_z)_{1-\beta-\gamma-\delta}B1_\beta B2_\gamma Fe_\delta\}O_3$ wherein
   A1 is Bi, La, Ce, Nd, or Sm or a combination thereof,
   B1 is Zn, Mg, Yb, Fe, Cu, Co, or Ni or a combination thereof, and
   B2 is Sn, Ti, Zr, Hf, Ce, Ge, V, W, Nb, Sb, or Ta or a combination thereof, and
   wherein the following inequalities are satisfied:

$0.500 \leq u \leq 0.540$, $0.00 < v \leq 0.06$, $0.00 < w \leq 0.06$, $0.99 \leq x \leq 1.02$, $0.00 < y \leq 0.12$, $0.00 < z \leq 0.10$, $0.0000 < \alpha \leq 0.0275$, $0.000 < \beta \leq 0.005$, $0.000 < \gamma \leq 0.005$, and $0.0000 < \delta \leq 0.0125$.

2. The piezoelectric ceramic composition according to claim 1,
   wherein A1 is Bi, B1 is Zn, and B2 is Sn, and the following formulae are satisfied:

$0.524 \leq u \leq 0.540$, $0.05 \leq v \leq 0.06$, $0.02 \leq w \leq 0.06$, $0.99 \leq x \leq 1.02$, $0.04 \leq y \leq 0.10$, $0.06 \leq z \leq 0.08$, $0.0050 \leq \alpha \leq 0.0125$, $0.000 < \beta \leq 0.005$, $\beta = \gamma$, and $0.00125 \leq \delta \leq 0.01000$.

3. A piezoelectric ceramic composition represented by a composition formula $A_xBO_3$, the piezoelectric ceramic composition comprising:
   potassium sodium niobate containing K and Na that account for 80% or more of an amount of A-site elements and containing Nb that accounts for 70% or more of an amount of B-site elements,
   wherein the piezoelectric ceramic composition comprises Ta and Fe at a B-site,
   wherein the piezoelectric ceramic composition comprises a Ta segregation part in which Ta is unevenly distributed, and
   wherein a ratio of an amount of Fe element to an amount of all elements in the Ta segregation part is larger than a ratio of an amount of Fe element to an amount of all elements in a reference part having at least a portion different from the Ta segregation part.

4. The piezoelectric ceramic composition according to claim 3,
   wherein, in the Ta segregation part, a ratio calculated by dividing an amount of Ta element by an amount of Nb element is 0.5 or more.

5. The piezoelectric ceramic composition according to claim 4,
   wherein, in the reference part, a ratio calculated by dividing an amount of Ta element by an amount of Nb element is $y/(1-y-z)$ or less; and
   wherein the piezoelectric ceramic composition is represented by a composition formula $\{(K_{1-u-v}Na_uLi_v)_{1-w-\alpha}Ag_wAl_\alpha\}_x\{(Nb_{1-y-z}Ta_ySb_z)_{1-\beta-\gamma-\delta}B1_\beta B2_\gamma Fe_\delta\}O_3$ wherein A1 is Bi, La, Ce, Nd, or Sm or a combination thereof, B1 is Zn, Mg, Yb, Fe, Cu, Co, or Ni or a combination thereof, and B2 is Sn, Ti, Zr, Hf, Ce, Ge, V, W, Nb, Sb, or Ta or a combination thereof.

6. The piezoelectric ceramic composition according to claim 3,
wherein a ratio calculated by dividing the amount of Fe element by an amount of Ta element in the Ta segregation part is smaller than a ratio calculated by dividing the amount of Fe element by an amount of Ta element in the reference part.

7. The piezoelectric ceramic composition according to claim 3,
wherein a ratio calculated by dividing the amount of Fe element by an amount of Ta element in the Ta segregation part is 0.01 or more and 0.12 or less.

8. The piezoelectric ceramic composition according to claim 7,
wherein the ratio calculated by dividing the amount of Fe element by the amount of Ta element in the Ta segregation part is 0.01 or more and 0.09 or less.

9. The piezoelectric ceramic composition according to claim 3,
wherein the piezoelectric ceramic composition comprises Sb at the B-site, and
a ratio calculated by dividing an amount of Sb element by an amount of Ta element in the Ta segregation part is smaller than a ratio calculated by dividing an amount of Sb element by an amount of Ta element in the reference part.

10. The piezoelectric ceramic composition according to claim 3,
wherein the piezoelectric ceramic composition comprises Sb at the B-site, and
a ratio calculated by dividing an amount of Sb element by an amount of Ta element in the Ta segregation part is 0.08 or more and 0.12 or less.

11. The piezoelectric ceramic composition according to claim 10,
wherein the ratio calculated by dividing the amount of Sb element by the amount of Ta element in the Ta segregation part is 0.09 or more and 0.12 or less.

12. The piezoelectric ceramic composition according to claim 3, comprising:
a cross section in which a ratio of an area occupied by the Ta segregation part is 1% or more.

13. The piezoelectric ceramic composition according to claim 3,
wherein the Ta segregation part has a grain size of 0.1 μm or more.

14. A piezoelectric ceramic composition represented by a composition formula AxBO3, the piezoelectric ceramic composition comprising:
potassium sodium niobate containing K and Na that account for 80% or more of an amount of A-site elements and containing Nb that accounts for 70% or more of an amount of B-site elements, wherein
the piezoelectric ceramic composition comprises Ta and Fe at a B-site,
the piezoelectric ceramic composition is represented by a composition formula wherein A1 is Bi, La, Ce, Nd, or Sm or a combination thereof, B1 is Zn, Mg, Yb, Fe, Cu, Co, or Ni or a combination thereof, B2 is Sn, Ti, Zr, Hf, Ce, Ge, V, W, Nb, Sb, or Ta or a combination thereof, and v, w, y, z, α, β, γ, and δ are larger than 0.

* * * * *